United States Patent
Narayanasamy

(10) Patent No.: US 11,255,887 B2
(45) Date of Patent: Feb. 22, 2022

(54) THREE PHASE CURRENT MEASUREMENT

(71) Applicant: TEXAS INSTRUMENTS INCORPORATED, Dallas, TX (US)

(72) Inventor: Navaneeth Kumar Narayanasamy, Coimbatore (IN)

(73) Assignee: Texas Instruments Incorporated, Dallas, TX (US)

( * ) Notice: Subject to any disclaimer, the term of this patent is extended or adjusted under 35 U.S.C. 154(b) by 221 days.

(21) Appl. No.: 16/669,687

(22) Filed: Oct. 31, 2019

(65) Prior Publication Data

US 2021/0132122 A1 May 6, 2021

(51) Int. Cl.
  *G01R 19/14* (2006.01)
  *G01R 19/25* (2006.01)
  *H02P 27/06* (2006.01)

(52) U.S. Cl.
  CPC ......... *G01R 19/14* (2013.01); *G01R 19/2506* (2013.01); *H02P 27/06* (2013.01)

(58) Field of Classification Search
  None
  See application file for complete search history.

(56) References Cited

U.S. PATENT DOCUMENTS

| 4,542,432 A | 9/1985 | Nichols, III |
| 4,683,513 A | 7/1987 | Miller |
| 5,815,357 A | 9/1998 | Innes |
| 2009/0189553 A1* | 7/2009 | Arnet ...................... H02P 21/22 318/400.3 |
| 2017/0310244 A1 | 10/2017 | Goetting |

OTHER PUBLICATIONS

International Search Report in corresponding PCT Application No. PCT/US2020/058473, dated Feb. 4, 2021 (3 pages).

* cited by examiner

*Primary Examiner* — Daniel C Puentes
(74) *Attorney, Agent, or Firm* — John R. Pessetto; Charles A. Brill; Frank D. Cimino

(57) ABSTRACT

A current measurement circuit includes first, second, and third conductors, a first current sensor, a second current sensor, and current computation circuitry. The first conductor is configured to conduct a first phase current of a three-phase current. The second conductor is configured to conduct a second phase current of the three-phase current. The third conductor is configured to conduct a third phase current of the three-phase current. The first current sensor is coupled to the first, the second, and the third conductors. The second current sensor is coupled to the second conductor and the third conductor. The current computation circuitry is coupled to the first current sensor and the second current sensor, and is configured to determine the first current, the second current, and the third current by applying an inverse Clarke transform to the output of the first current sensor and the output of the second current sensor.

15 Claims, 5 Drawing Sheets

THREE PHASE CURRENT MEASUREMENT

BACKGROUND

Efficient operation of electric machines, such as electric motors, powered by three phase inverters often requires control of the individual phase currents generated by the inverters. Measurement of the individual phase currents is an initial step in controlling the phase currents, and in protecting electronic power switches and electrical loads from damage caused by over current.

SUMMARY

A current measurement circuit that provides measurements of three individual phase currents using two current sensors is disclosed herein. In one example, a current measurement circuit includes a first current sensor, a second current sensor, and current computation circuitry. The first current sensor is coupled to a first conductor, a second conductor, and a third conductor. The second current sensor is coupled to the second conductor and the third conductor. The first conductor conducts a first phase current, the second conductor conducts a second phase current, and the third conductor conducts a third phase current. The current computation circuitry is coupled to the first current sensor and the second current sensor, and configured to: provide a measurement of the first phase current based an output of the first current sensor and an output of the second current sensor, provide a measurement of the second phase current based an output of the first current sensor and an output of the second current sensor, and provide a measurement of the third phase current based an output of the first current sensor and an output of the second current sensor. In some implementations of the current measurement circuit, the first current sensor comprises a turns ratio of 2:1:1 with respect to the first conductor, the second conductor, and the third conductor, and the second current sensor comprises a turns ratio of 1:1 with respect to the second conductor and the third conductor.

In another example, a current measurement circuit includes a first conductor, a second conductor, a third conductor, a first current sensor, a second current sensor, and current computation circuitry. The first conductor is configured to conduct a first phase current of a three-phase current. The second conductor is configured to conduct a second phase current of the three-phase current. The third conductor is configured to conduct a third phase current of the three-phase current. The first current sensor is coupled to the first conductor, the second conductor, and the third conductor. The second current sensor is coupled to the second conductor and the third conductor. The current computation circuitry is coupled to the first current sensor and the second current sensor, and is configured to determine the first phase current, the second phase current, and the third phase current by applying an inverse Clarke transform to an output of the first current sensor and an output of the second current sensor. In some implementations of the current measurement circuit, the first current sensor is configured to provide a turns ratio of 2:1:1 with respect to the first conductor, the second conductor, and the third conductor, and the second current sensor is configured to provide a turns ratio of 1:1 with respect to the second conductor and the third conductor.

In a further example, a method for measuring current includes measuring a sum of a first phase current, a second phase current, and a third phase current of a three-phase current in a first current sensor, and measuring a sum of the second phase current, and the third phase current of the three-phase current in a second current sensor. The method also includes determining the first phase current, the second phase current, and the third phase current by applying an inverse Clarke transform to the sum of the currents measured by the first current sensor and the sum of the currents measured by the second current sensor. Some implementations of the method also include measuring, in the first current sensor, the first phase current, the second phase current, and the third phase current respectively in a ratio of 2:1:1.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Some inverters and other electric machine control systems include current measurement circuits that apply separate sensors to measure each of the phase currents driving the electric machine. In such systems, a current measurement circuit includes three current sensors, where each current sensor measures one phase current of a three-phase current produced by an inverter. However, to reduce cost some systems measure only two of the three phase currents and compute the third phase current based on the sum of currents in a balanced load (e.g., an electric motor) being equal to zero. In such systems, because no current sensor is provided to measure the third phase current, the power devices (e.g., insulated gate bipolar transistors or silicon carbide metal oxide semiconductor field effect transistors) connected to the third phase cannot be protected from ground faults (overcurrent conditions).

Figure 1:
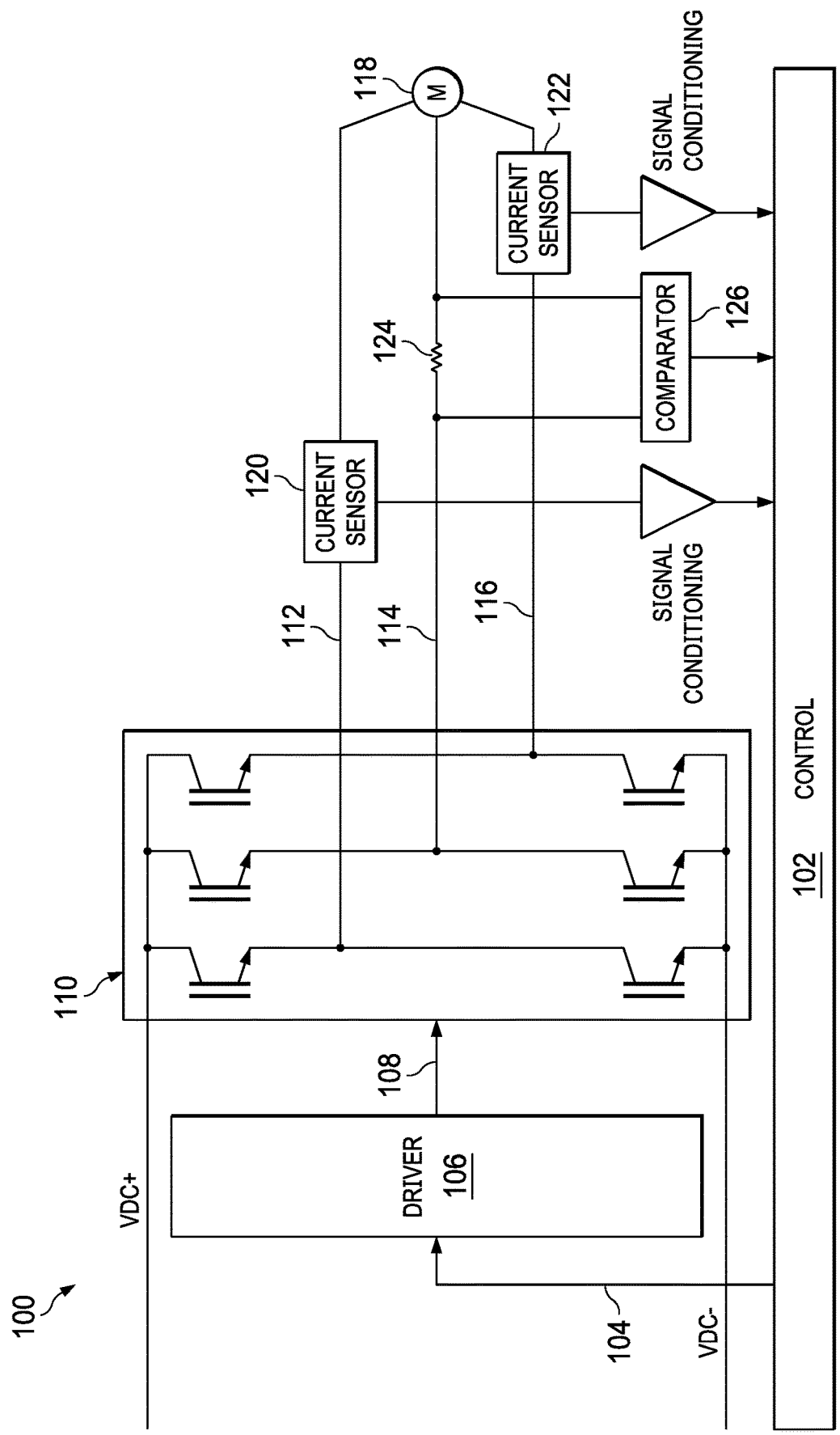
FIG. 1 shows a block diagram for a current measurement circuit that uses a comparator to identify overcurrent on a third phase.

To provide ground fault and overcurrent protection to power devices, some systems that include only two current sensors apply discrete comparators to detect faults on the third phase. FIG. 1 shows block diagram for a system 100 that uses a comparator to identify overcurrent on a third phase. In the system 100, a control circuit 102 generates pulse width modulation signals 104 that are provided to the driver circuit 106. The driver circuit 106 generates gate drive signals 108 for driving the transistors 110. The transistors 110 output three phase currents 112, 114, and 116 to drive the motor 118.

A current sensor 120 measures the phase current 112, and a current sensor 122 measures the phase current 116. To reduce cost, no current sensor is provided to measure the phase current 114. Instead, a comparator circuit 126 compares the voltage across a resistor 124 to a threshold to identify excessive current flow (an overcurrent condition). The comparator circuit 126 provides fault information to the control circuit 102, but no measurements of the phase current 114 are provided to the control circuit 102.

Figure 2:
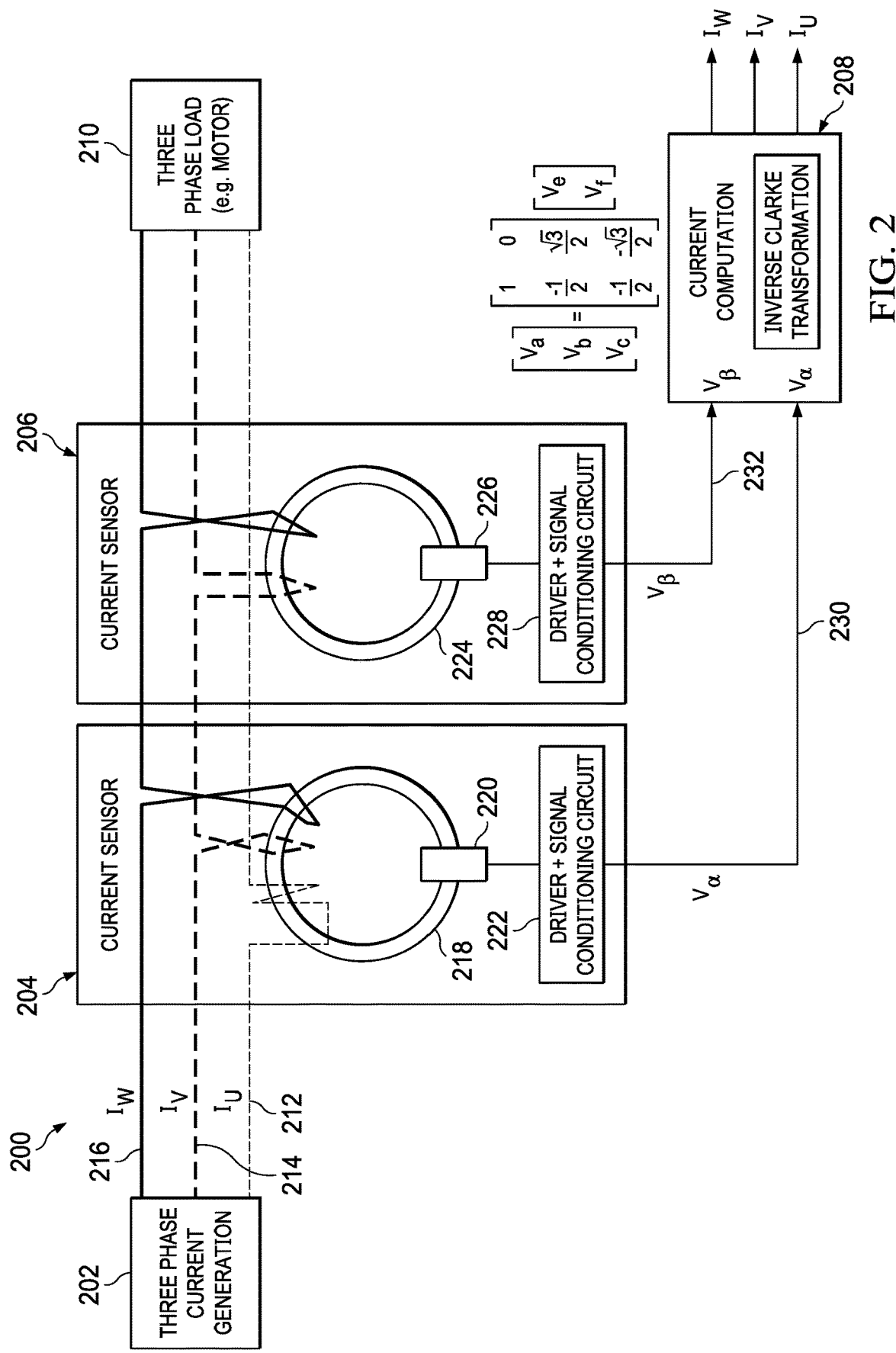
FIG. 2 shows a block diagram for an example current measurement circuit that includes two current sensors to individually measure each phase current of a three-phase current in accordance with this description.

FIG. 2 shows a block diagram for an example current measurement circuit 200 that includes two current sensors to measure the current in three phases in accordance with this description. While the system 100 provided measurements of only two of the three phase currents using two current sensors, the current measurement circuit 200 uses two current sensors (e.g., no more than two current sensors) to provide measurements of three phase currents. The current measurement circuit 200 includes a current sensor 204, a current sensor 206, current computation circuitry 208, a conductor 212, a conductor 214, and a conductor 216. The conductor 212 conducts a first phase current generated by a three-phase current generation circuit 202 to the three-phase load 210. The conductor 214 conducts a second phase current generated by a three-phase current generation circuit 202 to the three-phase load 210. The conductor 216 conducts a third phase current generated by a three-phase current generation circuit 202 to the three-phase load 210. In various implementations, the three-phase load 210 is an electric motor or any other electrical circuit/machine. In some implementations, the three-phase current generation circuit 202 includes the control circuit 102, driver circuit 106, and transistors 110 of the system 100. In some implementations, the three-phase current generation circuit 202 is an electrical grid directly powering the three-phase load 210.

The current sensor 204 is coupled to the conductor 212, the conductor 214, and the conductor 216. The current sensor 204 senses a sum of the first, second, and third phase currents. Some implementations of the current sensor 204 include a magnetic core 218 and a sensor element 220 coupled to the magnetic core 218. The sensor element 220 is a Hall sensor or a flux gate or any other current sensor in some implementations of the current sensor 204. The conductor 212, the conductor 214, and the conductor 216 are wound about the magnetic core 218 in a 2:1:1 turns ratio. That is, there are two turns of the conductor 212 about the magnetic core 218 for each turn of the conductor 214 and the conductor 216 about the magnetic core 218. The conductor 212 is wound about the magnetic core 218 in a direction opposite from the direction in which the conductor 214 and the conductor 216 are wound about the magnetic core 218. Thus, in the current sensor 204, current flow in the conductor 212 is in an opposite direction relative to the direction of current flow in the conductor 214 and the conductor 216.

The sensor element 220 detects the magnetic flux produced in the magnetic core 218 or in the air gap by the first, second, and third phase currents. The current sensor 204 includes signal conditioning circuitry 222 coupled to the sensor element 220. Some implementations of the signal conditioning circuitry 222 include an amplifier that drives output of the sensor element 220 to the current computation circuitry 208 as signal 230. Some implementations of the signal conditioning circuitry 222 include an analog-to-digital converter to digitize output of the sensor element 220 and/or other digital circuit, such as a voltage-to-frequency converter, a voltage-to-pulse-width-modulation converter, encoder circuitry, transmitter/driver circuitry, etc. Thus, in various implementations of the current sensor 204, the signal 230 comprising the output of the sensor element 220 is provided to the current computation circuitry 208 as an analog signal or a digital signal. Given the described configuration of the current sensor 204, the signal 230 may be expressed as:

$$V_\alpha = F\{0.666I_U - 0.333I_V - 0.333I_W\}$$

where:

$I_U$ is the first phase current (the current in the conductor 212);

$I_V$ is the second phase current (the current in the conductor 214); and $I_W$ is the third phase current (the current in the conductor 216).

The current sensor 206 is coupled to the conductor 214 and the conductor 216. The current sensor 206 senses a sum of the second and third phase currents. Some implementations of the current sensor 206 include a magnetic core 224 and a sensor element 226 coupled to the magnetic core 224. The sensor element 226 is a Hall sensor or a flux gate sensor in some implementations of the current sensor 206. The conductor 214 and the conductor 216 are wound about the magnetic core 218 in a 1:1 turns ratio. That is, for each turn of the conductor 214 about the magnetic core 224 there is one turn of the conductor 216 about the magnetic core 224. The conductor 214 is wound about the magnetic core 224 in a direction opposite from the direction in which the conductor 216 is wound about the magnetic core 224. Thus, in the current sensor 206, current flow in the conductor 214 is in an opposite direction relative to the direction of current flow in the conductor 216.

The current sensor 206 includes signal conditioning circuitry 228 coupled to the sensor element 226. Some implementations of the signal conditioning circuitry 228 include an amplifier that drives output of the sensor element 226 to the current computation circuitry 208 as the signal 232. Some implementations of the signal conditioning circuitry 228 include an analog-to-digital converter to digitize output of the sensor element 226 and/or other digital circuit, such as a voltage-to-frequency converter, a voltage-to-pulse-width-modulation converter, encoder circuitry, transmitter/driver circuitry, etc. Thus, in various implementations of the current sensor 206 the signal 232 comprising the output of the sensor element 226 is provided to the current computation circuitry 208 as an analog signal or a digital signal. Given the described configuration of the current sensor 206, the signal 232 may be expressed as:

$$V_\beta = F\{0.57737(I_V - I_W)\}$$

The current sensor 204 and the current sensor 206 are configured to utilize a Clarke transformation to convert the three phase currents into two phases. The Clarke transformation matrix is expressed as:

$$\begin{bmatrix} I_\alpha \\ I_\beta \end{bmatrix} = \sqrt{\frac{2}{3}} \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} I_U \\ I_V \\ I_W \end{bmatrix}$$

The current computation circuitry 208 is coupled to the current sensor 204 and the current sensor 206, and processes the signal 230 and the signal 232 to generate measurements of the first, second, and third phase currents respectively conducted by the conductor 212, the conductor 214, and the conductor 216. Implementations of the current computation circuitry 208 apply an inverse Clarke transform to the signal 230 and the signal 232 to produce the measurements. The inverse Clarke transformation matrix applied by the current computation circuitry 208 is expressed as:

$$\begin{bmatrix} I_U \\ I_V \\ I_W \end{bmatrix} = \sqrt{\frac{2}{3}} \begin{bmatrix} 1 & 0 \\ \frac{1}{2} & \frac{\sqrt{3}}{2} \\ -\frac{1}{2} & -\frac{\sqrt{3}}{2} \end{bmatrix} \begin{bmatrix} I_\alpha \\ I_\beta \end{bmatrix}$$

Various examples of the current computation circuitry 208 include hardware circuitry dedicated to implementing the inverse Clarke transform, or include a processor, such as a microcontroller or a digital signal processor that executes instructions stored in memory to implement the inverse Clarke transformation, or implement the inverse Clarke transform using a combination of hardware and software.

Figure 3:
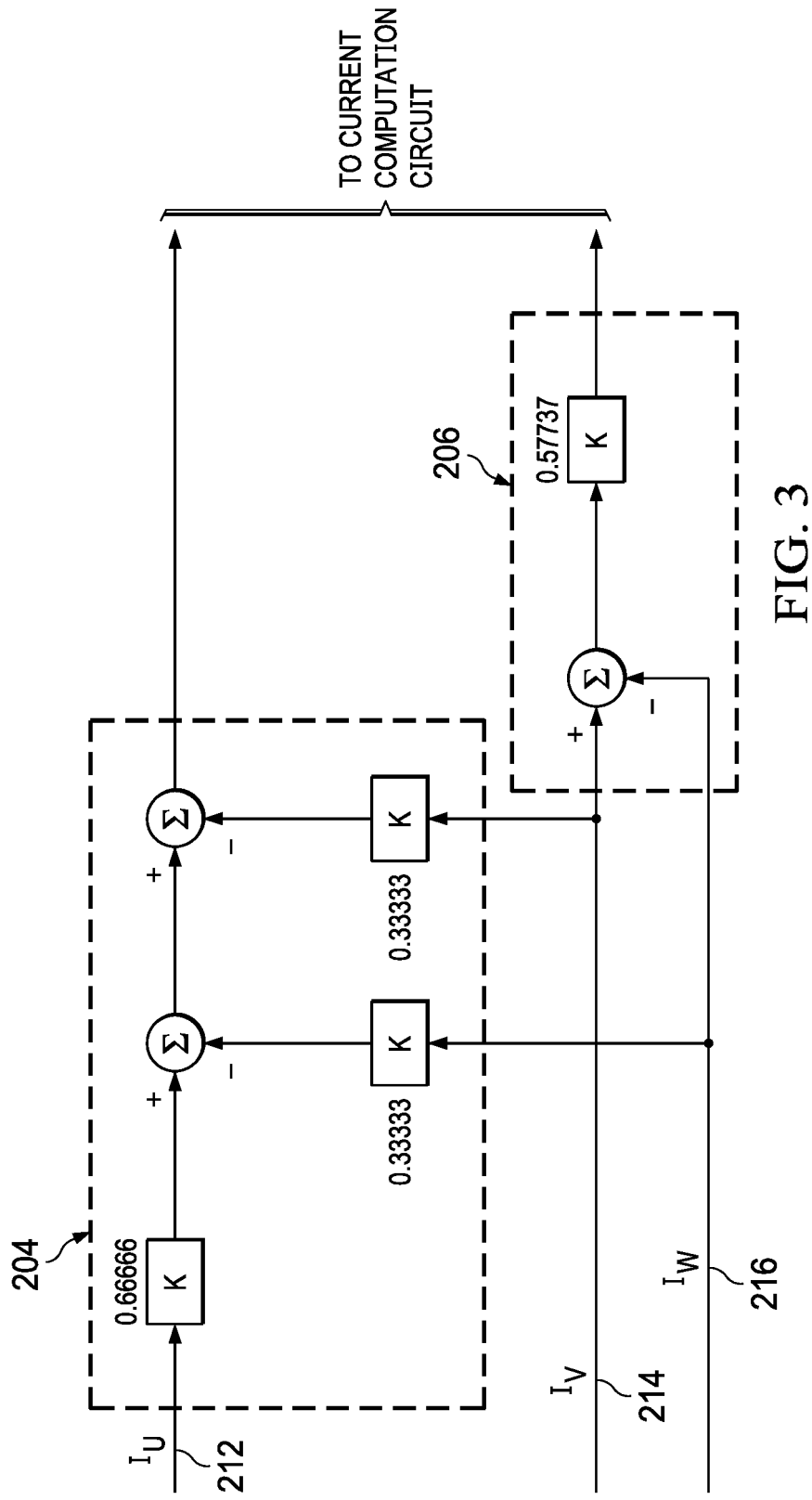
FIG. 3 shows an example summation of the phase currents in the two current sensors of FIG. 2 in accordance with this description.

FIG. 3 shows an example summation of the phase currents in the current sensor 204 and the current sensor 206 in accordance with this description. The output of the current sensor 204 is a sum of the first phase current ($I_U$) conducted by the conductor 212 scaled by 0.6666, the second phase current ($I_V$) conducted by the conductor 214 scaled by −0.3333, and the third phase current ($I_W$) conducted by the conductor 216 scaled by −0.3333. The output of the current sensor 206 is the sum of the second phase current ($I_V$) and the negated third phase current ($I_W$), where the sum is scaled by 0.57737.

Figure 4:
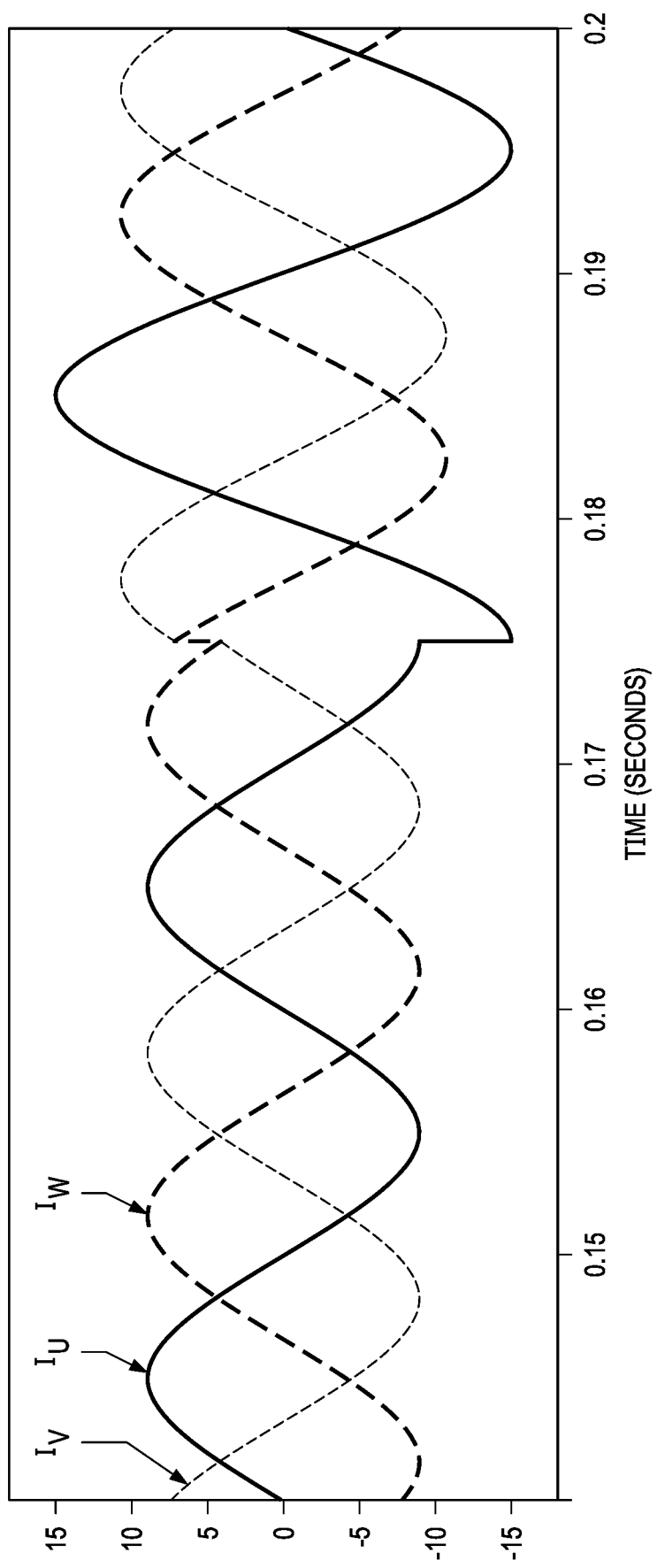
FIG. 4 shows an example of detection of an overcurrent condition in a current measurement circuit that includes two current sensors in accordance with this description.

FIG. 4 shows an example of detection of an overcurrent condition by the current measurement circuit current measurement circuit 200. The three phase current values ($I_U$, $I_V$, and $I_W$) illustrated in FIG. 4, are generated, as disclosed herein, by the current computation circuitry 208 based on the signal 230 and the signal 232 respectively provided by the current sensor 204 and the current sensor 206. At about time 0.175 seconds, the current drawn from the conductor 212 ($I_U$) increases to create an overcurrent condition. The increase in the first phase current ($I_U$) is reflected in the increased amplitude of the first phase current ($I_U$) values generated by the current computation circuitry 208.

While FIG. 2 illustrates the current sensor 204 and the current sensor 206 as including a magnetic core about which the conductor 212, the conductor 214, and the conductor 216 are wound, some implementations of the current sensor 204 and the current sensor 206 do not include a magnetic core. In such implementations, the conductor 212, the conductor 214, and the conductor 216 are positioned relative to the sensor element such that current flowing in the conductors creates a magnetic field according to the desired direction and turns ratio for detection by the sensor element.

Figure 5:
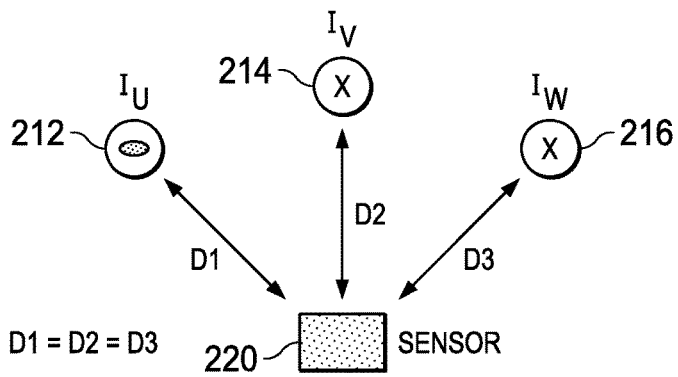
FIGS. 5 and 6 show example arrangements of conductors relative to a sensor element in a current sensor in accordance with this description.

FIG. 5 shows the conductor 212, the conductor 214, and the conductor 216 disposed at equal distance from the sensor element 220. In the conductors, a dot represent current flow in a first direction and an X represents current flow in the direction opposite that of the dot. With the conductor 212, conductor 214, and conductor 216 equidistant from the sensor element 220, two turns of the conductor 212 are needed for each turn of the conductor 214 and the conductor 216 to provide the desired 2:1:1 ratio of the current signals for summation.

Figure 6:
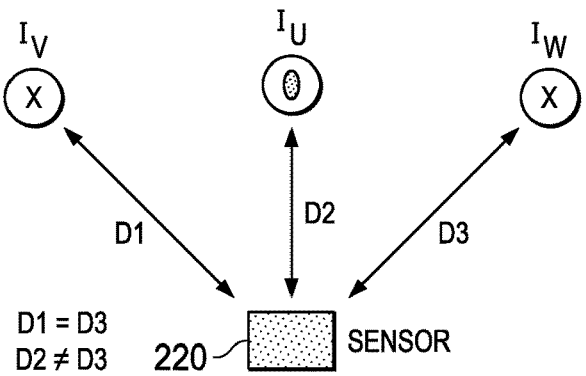

FIG. 6 shows the conductor 212 at difference distance from the sensor element 220 than the conductor 214 or the conductor 216. The conductor 212 is disposed nearer the sensor element 220 than the conductor 214 or the conductor 216. The conductor 214 and the conductor 216 are equidistant from the sensor element 220. By disposing the conductor 212 nearer the sensor element 220 (than the conductors 214 or 216), the magnetic field detected by the sensor element 220 due to current flow in the conductor 212 is relatively stronger than the magnetic field due to current flow in the conductor 214 of the conductor 216. Thus, by positioning the conductor 212 closer to the sensor element 220 than the conductor 214 or conductor 216, implementations of the current sensor 204 apply a turns ratio of 1:1:1 to provide the equivalent of the 2:1:1 signal ratio without using multiple turns of the conductor 212.

Figure 7:
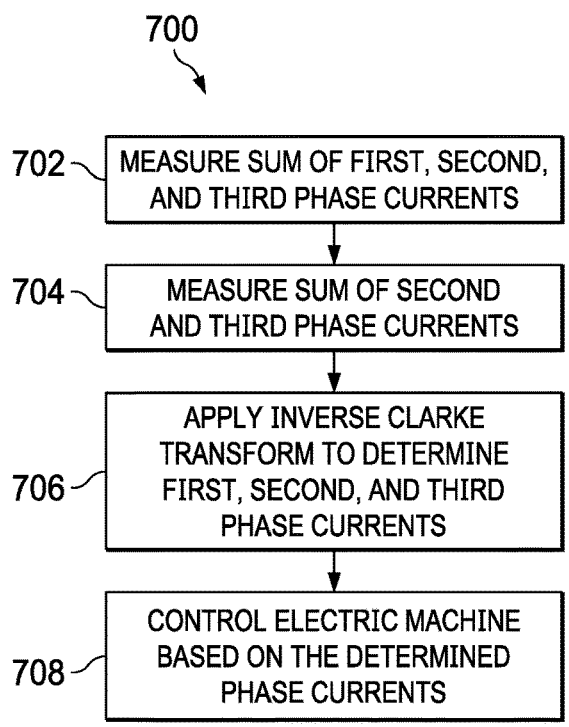
FIG. 7 shows a flow diagram for a method for current measurement that uses two current sensors to individually measure each phase current of a three-phase current in accordance with this description.

FIG. 7 shows a flow diagram for a method 700 for current measurement that uses two current sensors to individually measure each phase current of a three-phase current in accordance with this description. Though depicted sequentially as a matter of convenience, at least some of the actions shown can be performed in a different order and/or performed in parallel. Additionally, some implementations may perform only some of the actions shown. Operations of the method 700 are performed by an implementation of the current measurement circuit 200.

In block 702, the current sensor 204 measures a sum of the first phase current ($I_U$), the second phase current ($I_V$), and the third phase current ($I_W$) respectively flowing in the conductor 212, the conductor 214, and the conductor 216. The first phase current ($I_U$), the second phase current ($I_V$), and the third phase current ($I_W$) are scaled for the sum in a ratio of 2:1:1. The flow of the first phase current ($I_U$) is in a first direction, and flow of the second phase current ($I_V$), and the third phase current ($I_W$) is in a direction opposite the first direction.

In block 704, the current sensor 206 measures a sum of the second phase current ($I_V$) and the third phase current ($I_W$) respectively flowing in the conductor 214 and the conductor 216. The second phase current ($I_V$) and the third phase current ($I_W$) are scaled for the sum in a ratio of 1:1. The flow of the second phase current ($I_V$) is in a first direction and the flow of the third phase current ($I_W$) is in a direction opposite the first direction.

In block 706, the current computation circuitry 208 applies an inverse Clarke transform to the signal 230 (the sum of currents measured by the current sensor 204) and the signal 232 (the sum of currents measured by the current sensor 206). The inverse Clarke transform produces as output individual measurements of the first phase current ($I_U$), the second phase current ($I_V$), and the third phase current ($I_W$).

In block 708, the individual measurements of the first phase current ($I_U$), the second phase current ($I_V$), and the third phase current ($I_W$) generated in block 706 are applied to control the operation of an electric machine or other three-phase electrical load. For example, if one of the phase currents exceeds a threshold, then current provided to operation the electric machine may be reduced.

Modifications are possible in the described embodiments, and other embodiments are possible, within the scope of the claims.

What is claimed is:

1. A current measurement circuit, comprising:
a first current sensor coupled to a first conductor, a second conductor, and a third conductor;
a second current sensor coupled to the second conductor and the third conductor, wherein the first conductor conducts a first phase current, the second conductor conducts a second phase current, and the third conductor conducts a third phase current; and
current computation circuitry coupled to the first current sensor and the second current sensor, and configured to:
generate a measurement of the first phase current based an output of the first current sensor and an output of the second current sensor;
generate a measurement of the second phase current based an output of the first current sensor and an output of the second current sensor; and
generate a measurement of the third phase current based an output of the first current sensor and an output of the second current sensor;
wherein the current computation circuitry is configured to determine the first phase current, the second phase current, and the third phase current by applying an inverse Clarke transform to the output of the first current sensor and the output of the second current sensor.

2. A current measurement circuit, comprising:
a first current sensor coupled to a first conductor, a second conductor, and a third conductor;
a second current sensor coupled to the second conductor and the third conductor, wherein the first conductor conducts a first phase current, the second conductor conducts a second phase current, and the third conductor conducts a third phase current; and
current computation circuitry coupled to the first current sensor and the second current sensor, and configured to:
generate a measurement of the first phase current based an output of the first current sensor and an output of the second current sensor;
generate a measurement of the second phase current based an output of the first current sensor and an output of the second current sensor; and
generate a measurement of the third phase current based an output of the first current sensor and an output of the second current sensor;
wherein the first current sensor comprises a turns ratio of 2:1:1 with respect to the first conductor, the second conductor, and the third conductor.

3. A current measurement circuit, comprising:
a first current sensor coupled to a first conductor, a second conductor, and a third conductor;
a second current sensor coupled to the second conductor and the third conductor, wherein the first conductor conducts a first phase current, the second conductor conducts a second phase current, and the third conductor conducts a third phase current; and
current computation circuitry coupled to the first current sensor and the second current sensor, and configured to:
generate a measurement of the first phase current based an output of the first current sensor and an output of the second current sensor;
generate a measurement of the second phase current based an output of the first current sensor and an output of the second current sensor; and
generate a measurement of the third phase current based an output of the first current sensor and an output of the second current sensor;
wherein the second current sensor comprises a turns ratio of 1:1 with respect to the second conductor and the third conductor.

4. A current measurement circuit, comprising:
a first current sensor coupled to a first conductor, a second conductor, and a third conductor;
a second current sensor coupled to the second conductor and the third conductor, wherein the first conductor conducts a first phase current, the second conductor conducts a second phase current, and the third conductor conducts a third phase current; and
current computation circuitry coupled to the first current sensor and the second current sensor, and configured to:
generate a measurement of the first phase current based an output of the first current sensor and an output of the second current sensor;
generate a measurement of the second phase current based an output of the first current sensor and an output of the second current sensor; and
generate a measurement of the third phase current based an output of the first current sensor and an output of the second current sensor;
wherein:
the first current sensor comprises a turns ratio of 1:1:1 with respect to the first conductor, the second conductor, and the third conductor; and
the first current sensor comprises a sensor element disposed at a first distance from the first conductor and at a second distance from the second conductor and the third conductor; wherein the first distance is smaller than the second distance.

5. A current measurement circuit, comprising:
a first conductor configured to conduct a first phase current of a three-phase current;
a second conductor configured to conduct a second phase current of the three-phase current;
a third conductor configured to conduct a third phase current of the three-phase current;
a first current sensor coupled to the first conductor, the second conductor, and the third conductor;
a second current sensor coupled to the second conductor and the third conductor; and
current computation circuitry coupled to the first current sensor and the second current sensor, and configured to determine the first phase current, the second phase current, and the third phase current by applying an inverse Clarke transform to an output of the first current sensor and an output of the second current sensor.

6. The current measurement circuit of claim 5, wherein the first current sensor is configured to provide current flow in the first conductor that is opposite in direction relative to a direction of current flow in the second conductor and the third conductor.

7. The current measurement circuit of claim 5, wherein the second current sensor is configured to provide current flow in the second conductor that is opposite in direction relative to a direction of current flow in the third conductor.

8. The current measurement circuit of claim 5, wherein the first current sensor is configured to provide a turns ratio of 2:1:1 with respect to the first conductor, the second conductor, and the third conductor.

9. The current measurement circuit of claim 8, wherein the first current sensor is configured to dispose the first conductor, the second conductor, and the third conductor at a same distance from a sensor element.

10. The current measurement circuit of claim 5, wherein the second current sensor is configured to provide a turns ratio of 1:1 with respect to the second conductor and the third conductor.

11. The current measurement circuit of claim 5, wherein:
the first current sensor is configured to provide a turns ratio of 1:1:1 with respect to the first conductor, the second conductor, and the third conductor;
a sensor element of the first current sensor is disposed at a first distance from the first conductor and at a second distance from the second conductor and the third conductor; and
the first distance is smaller than the second distance.

12. A method for measuring current, comprising:
measuring a sum of a first phase current, a second phase current, and a third phase current of a three-phase current in a first current sensor;
measuring a sum of the second phase current, and the third phase current of a three-phase current in a second current sensor; and
determining, by current computation circuitry, the first phase current, the second phase current, and the third phase current by applying an inverse Clarke transform to the sum of the currents measured by the first current sensor and the sum of the currents measured by the second current sensor.

13. The method of claim 12, further comprising measuring, in the first current sensor, the first phase current in a direction opposite the direction of the second phase current and the third phase current.

14. The method of claim 12, further comprising measuring, in the second current sensor, the second phase current in a direction opposite the direction of the third phase current.

15. The method of claim 12, further comprising measuring, in the first current sensor, the first phase current, the second phase current, and the third phase current respectively in a ratio of 2:1:1.

* * * * *